(12) United States Patent
Sherman et al.

(10) Patent No.: US 7,701,197 B2
(45) Date of Patent: Apr. 20, 2010

(54) CURRENT SENSING ASSEMBLY

(75) Inventors: Randal Sherman, Sycamore, IL (US); Shin Katsumata, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 256 days.

(21) Appl. No.: 12/106,305

(22) Filed: Apr. 20, 2008

(65) Prior Publication Data
US 2009/0261812 A1 Oct. 22, 2009

(51) Int. Cl.
*G01R 33/00* (2006.01)
(52) U.S. Cl. .................... 324/117 H; 324/126; 324/127
(58) Field of Classification Search .................. None
See application file for complete search history.

(56) References Cited

U.S. PATENT DOCUMENTS 6,442,011 B1 * 8/2002 Attarian et al. ............ 361/93.1
6,531,862 B1 * 3/2003 Stanley ...................... 324/127

\* cited by examiner

*Primary Examiner*—Minh N Tang
(74) *Attorney, Agent, or Firm*—Stephen G. Mican

(57) ABSTRACT

An electrical current sensing assembly comprises: a conductive input substrate with a generally planar contact surface; a conductive output substrate with a generally planar contact surface proximate and substantially parallel to the input substrate contact surface; a conductive current sense path extending from the input substrate contact surface to the output substrate contact surface with a sense path cross sectional area generally normal to electrical current flow; a conductive current bypass path extending from the input substrate contact surface to the output substrate contact surface with a bypass path cross sectional area generally normal to electrical current flow; and an electrical current sensing device proximate the current sense path for sensing electrical current passing through the current sense path; wherein the ratio of the current passing through the bypass path to the current passing through the sense path is proportional to the ratio of the bypass path cross sectional area to the sensing path cross sectional area to limit current in the sensing path to the measurement range of the current sensing device.

20 Claims, 1 Drawing Sheet

CURRENT SENSING ASSEMBLY

FIELD OF THE INVENTION

The invention relates to an electrical current sensing assembly, and more particularly to a current sensing assembly for sensing high levels of electrical current.

BACKGROUND OF THE INVENTION

Aeronautical electric power generating and distributing systems require small electrical current sensing devices for tracking and regulating electrical power. However, the level of electrical current in such systems, often in the range of tens of amperes, is beyond the range of miniature current sensing devices. Therefore, it is necessary to implement current sensing assemblies that divide the electrical current into fixed ratio sense and bypass current paths, with the current in the sensing path limited to the sensing range of a selected miniature current sensing device.

A current sensing assembly representative of the prior art has a generally planar construction with a current sensing path and current bypass path that extends within the plane of the assembly. The ratio of their relative lengths determines the ratio of current divided between the sensing path and the bypass path. Although this type of construction provides satisfactory operation over a wide range of electrical power frequencies, it is too bulky for some applications due to the "footprint" of its generally planar current sensing path.

SUMMARY OF THE INVENTION

The invention generally comprises an electrical current sensing assembly comprising: a conductive input substrate with a generally planar contact surface; a conductive output substrate with a generally planar contact surface proximate and substantially parallel to the input substrate contact surface; a conductive current sense path extending from the input substrate contact surface to the output substrate contact surface with a sense path cross sectional area generally normal to electrical current flow; a conductive current bypass path extending from the input substrate contact surface to the output substrate contact surface with a bypass path cross sectional area generally normal to electrical current flow; and an electrical current sensing device proximate the current sense path for sensing electrical current passing through the current sense path; wherein the ratio of the current passing through the bypass path to the current passing through the sense path is proportional to the ratio of the bypass path cross sectional area to the sensing path cross sectional area to limit current in the sensing path to the measurement range of the current sensing device.

DETAILED DESCRIPTION OF THE INVENTION

Figure 1:
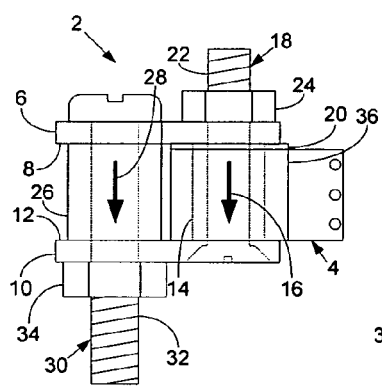
FIG. 1 is a side view of a complete electrical current sensing assembly according to a possible embodiment of the invention.
Figure 2:
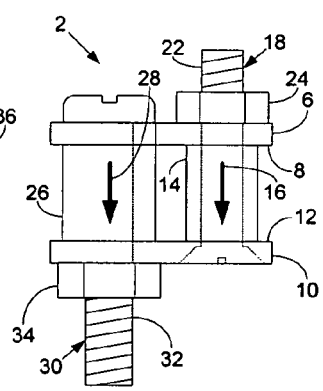
FIG. 2 is a side view of the current sensing assembly according to a possible embodiment of the invention less its sensing device.
Figure 3:
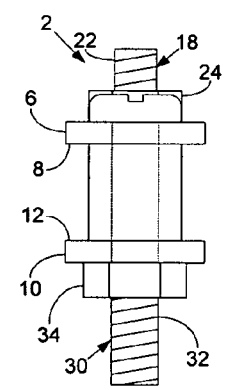
FIG. 3 is an end view of the current sensing assembly according to a possible embodiment of the invention less its sensing device.

FIG. 1 is a side view of a complete current sensing assembly 2 according to a possible embodiment of the invention complete with a current sensing device 4. FIG. 2 is a side view of the current sensing assembly 2 less its sensing device 4. FIG. 3 is an end view of the current sensing assembly 2 less its sensing device 4. Referring to FIGS. 1 through 3 together, the current sensing assembly 2 comprises a conductive input substrate 6 with a generally planar contact surface 8 and a conductive output substrate 10 with a generally planar contact surface 12. The output substrate contact surface 12 is proximate and substantially parallel to the input substrate contact surface 8. The input substrate 6 and the output substrate 10 as shown in FIGS. 1 through 3 are generally rectangular by way of illustration only and they may have any convenient shape, such as a block or bar. Moreover, the input substrate 6 may comprise an electrical power supply bus and the output substrate 10 may comprise an electrical distribution bus.

A conductive current sense path 14 extends from the input substrate contact surface 8 to the output substrate contact surface 12. Electrical current may flow from the input substrate 6 to the output substrate 10 through the current sense path 14 as indicated by sense current arrow 16. The current sense path 14 has a cross sectional area generally normal to electrical current flow as indicated by the sense current arrow 16. The current sense path 14 as shown in FIGS. 1 through 3 is generally cylindrical by way of illustration only and it may have any convenient shape, such as a block or bar.

A sense path fastener 18 may pass through the input substrate 6, the output substrate 10 and the current sense path 14 to secure the input substrate 6 and the output substrate 10 to the current sense path 14. The sensing device 4 may also mount coaxially on the sensing path 14 as shown in FIG. 1. The sense path fastener 18 then secures the sensing device 4 to the input substrate 6, the output substrate 10 and the sensing path 14. An elastomeric washer 20 mounted coaxially on the sensing path may prevent rotational movement of the sensing device 4 about the sensing path 14. The sense path fastener 18 may conveniently comprise a threaded sense path screw 22 and nut 24.

A conductive current bypass path 26 extends from the input substrate contact surface 8 to the output substrate contact surface 12. Electrical current may flow from the input substrate 6 to the output substrate 10 through the current bypass path 26 as indicated by bypass current arrow 28. The current bypass path 26 has a cross sectional area generally normal to electrical current flow as indicated by the bypass current arrow 28. The current bypass path 26 as shown in FIGS. 1 through 3 is generally cylindrical by way of illustration only and it may have any convenient shape, such as a block or bar.

A bypass path fastener 30 may pass through the input substrate 6, the output substrate 10 and the current bypass path 26 to secure the input substrate 6 and the output substrate 10 to the current bypass path 26. The bypass path fastener 30 may conveniently comprise a threaded bypass path screw 32 and nut 34.

The ratio of the current passing through the current bypass path 26 to the ratio of the current passing through the current sense path 16 is proportional to the ratio of the cross sectional area of the current bypath path 26 to the cross sectional area of the current sensing path 16. The sensing device 4 may be of any type that may measure the range of current that passes through the current sensing path 16. The sensing device 4 may conveniently comprise a Hall Effect sensor with its sensing region mounted coaxially with the current sensing path 16 as shown in FIG. 1.

The described embodiment of the invention is only an illustrative implementation of the invention wherein changes The claimed invention is:

1. An electrical current sensing assembly comprising:
   a conductive input substrate with a generally planar contact surface;
   a conductive output substrate with a generally planar contact surface proximate and substantially parallel to the input substrate contact surface;
   a conductive current sense path extending from the input substrate contact surface to the output substrate contact surface with a sense path cross sectional area generally normal to electrical current flow;
   a conductive current bypass path extending from the input substrate contact surface to the output substrate contact surface with a bypass path cross sectional area generally normal to electrical current flow; and
   an electrical current sensing device proximate the current sense path for sensing electrical current passing through the current sense path;
   wherein the ratio of the current passing through the bypass path to the current passing through the sense path is proportional to the ratio of the bypass path cross sectional area to the sensing path cross sectional area to limit current in the sensing path to the measurement range of the current sensing device.

2. The sensing assembly of claim 1, wherein the sense and bypass paths are generally perpendicular to the input substrate and output substrate contact surfaces.

3. The sensing assembly of claim 1, wherein the current sensing device mounts coaxially with the sensing path.

4. The sensing assembly of claim 1, wherein the sense and bypass paths are generally cylindrical.

5. The sensing assembly of claim 1, wherein the input and output substrates are generally rectangular.

6. The sensing assembly of claim 1, wherein at least one fastener passes through input substrate, the output substrate and the bypass path to secure the input and output substrates to the bypass path.

7. The sensing assembly of claim 6, wherein the fastener comprises a threaded screw and nut.

8. The sensing assembly of claim 1, wherein at least one fastener passes through the input substrate, the output substrate and the sense path to secure the input and output substrates to the sense path.

9. The sensing assembly of claim 8, wherein the fastener comprises a threaded screw and nut.

10. The sensing assembly of claim 1, wherein the input substrate comprises an electrical power supply bus.

11. The sensing assembly of claim 1, wherein the output substrate comprises an electrical distribution bus.

12. The sensing assembly of claim 1, wherein the current sensing device comprises a Hall Effect sensor and the sense path passes through a sensing region of the Hall Effect sensor.

13. An electrical current sensing assembly comprising:
    a generally rectangular conductive input substrate with a generally planar contact surface;
    a generally rectangular conductive output substrate with a generally planar contact surface proximate and substantially parallel to the input substrate contact surface;
    a generally cylindrical conductive current sense path extending from the input substrate contact surface to the output substrate contact surface with a sense path cross sectional area generally normal to electrical current flow;
    a generally cylindrical conductive current bypass path extending from the input substrate contact surface to the output substrate contact surface with a bypass path cross sectional area generally normal to electrical current flow; and
    an electrical current sensing device with a sensing region mounted coaxially with the current sense path for sensing electrical current passing through the current sense path;
    wherein the ratio of the current passing through the bypass path to the current passing through the sense path is proportional to the ratio of the bypass path cross sectional area to the sensing path cross sectional area to limit current in the sensing path to the measurement range of the current sensing device.

14. The sensing assembly of claim 13, wherein at least one fastener passes through input substrate, the output substrate and the bypass path to secure the input and output substrates to the bypass path.

15. The sensing assembly of claim 14, wherein the fastener comprises a threaded screw and nut.

16. The sensing assembly of claim 13, wherein at least one fastener passes through the input substrate, the output substrate and the sense path to secure the input and output substrates to the sense path.

17. The sensing assembly of claim 16, wherein the fastener comprises a threaded screw and nut.

18. The sensing assembly of claim 13, wherein the input substrate comprises an electrical power supply bus.

19. The sensing assembly of claim 13, wherein the output substrate comprises an electrical distribution bus.

20. An electrical current sensing assembly comprising:
    a generally rectangular conductive input substrate with a generally planar contact surface;
    a generally rectangular conductive output substrate with a generally planar contact surface proximate and substantially parallel to the input substrate contact surface;
    a generally cylindrical conductive current sense path extending from the input substrate contact surface to the output substrate contact surface with a sense path cross sectional area generally normal to electrical current flow;
    a generally cylindrical conductive current bypass path extending from the input substrate contact surface to the output substrate contact surface with a bypass path cross sectional area generally normal to electrical current flow;
    a Hall Effect sensing device with a sensing region mounted coaxially with the current sense path for sensing electrical current passing through the current sense path;
    at least one fastener that passes through input substrate, the output substrate and the bypass path to secure the input and output substrates to the bypass path; and
    at least one fastener passes through the input substrate, the output substrate and the sense path to secure the input and output substrates to the sense path and the Hall Effect sensing device;
    wherein the ratio of the current passing through the bypass path to the current passing through the sense path is proportional to the ratio of the bypass path cross sectional area to the sensing path cross sectional area to limit current in the sensing path to the measurement range of the Hall Effect sensing device.

* * * * *